United States Patent [19]

Fenstermacher

[11] 3,947,687

[45] Mar. 30, 1976

[54] COLLIMATED X-RAY SOURCE FOR X-RAY LITHOGRAPHIC SYSTEM

[75] Inventor: Thomas E. Fenstermacher, Silver Spring, Md.

[73] Assignee: The United States of America as represented by the Secretary of the Air Force, Washington, D.C.

[22] Filed: Oct. 23, 1974

[21] Appl. No.: 517,341

[52] U.S. Cl............................ 250/492 A; 250/505
[51] Int. Cl.²....................................... G01N 21/34
[58] Field of Search ........ 250/320, 321, 492 A, 505

[56] References Cited
UNITED STATES PATENTS

| 3,447,924 | 6/1969 | Trzyne et al.................... 250/321 |
| 3,742,229 | 6/1973 | Smith et al..................... 250/394 |
| 3,742,230 | 6/1973 | Spears et al.................... 250/505 |
| 3,743,842 | 7/1973 | Smith et al..................... 250/320 |
| 3,867,637 | 2/1975 | Braun et al. :................... 250/505 |

Primary Examiner—Archie R. Borchelt
Assistant Examiner—B. C. Anderson
Attorney, Agent, or Firm—Joseph E. Rusz; Willard B. Matthews, Jr.

[57] ABSTRACT

In an X-ray lithographic system, high power X-ray illumination of photo-resist coated substrate members is accomplished by projecting a collimated X-ray beam, emitted from an extended area X-ray source, through the patterned apertures of an X-ray absorbent mask. Improved efficiency is achieved by limiting X-ray emission to the discrete portions of the extended area emission surface that corresponds to related patterned mask apertures.

1 Claim, 3 Drawing Figures

COLLIMATED X-RAY SOURCE FOR X-RAY LITHOGRAPHIC SYSTEM

STATEMENT OF GOVERNMENT INTEREST

The invention described herein may be manufactured and used by or for the Government for governmental purposes without the payment of any royalty thereon.

BACKGROUND OF THE INVENTION

This invention relates to X-ray lithography and in particular to apparatus for projecting patterned X-ray illumination onto the photo-resist coated substrate members employed in X-ray lithographic systems.

X-ray lithographic systems use X-rays, projected through a mask, to expose an X-ray resist. The procedure replicates mask patterns on resist coated substrate members. The exposure time depends upon the amount of X-ray power available at the mask. Because the system is a projective one, the X-rays must be nearly parallel to each other. Thus a point X-ray source is commonly used in state of the art systems. Point X-ray sources, however, have power limitations that necessitate extended exposure times and otherwise limit their usefulness in such systems. Furthermore, the point X-ray sources used in currently available systems must necessarily illuminate the entire mask surface thereby significantly reducing the efficiency of the system. There currently exists therefore the need for higher powered, more efficient X-ray sources for X-ray lithographic applications. The present invention is directed toward satisfying this need.

SUMMARY OF THE INVENTION

The invention comprehends the use of an X-ray source having a wide area X-ray emitting surface to provide a high power X-ray beam. The lithographic projection requirement for parallel X-rays is met by the use of an X-ray collimator disposed between the wide area X-ray emitting surface and the system mask. Improved efficiency is achieved by effecting projection of X-rays from only the particular portion of the wide area X-ray emitting surface that corresponds to related patterned mask apertures.

It is a principal object of the invention to provide a new and improved collimated X-ray source for X-ray lithographic systems.

It is another object of the invention to provide, for use in an X-ray lithographic system, an X-ray source having higher power capabilities than currently available point X-ray sources.

It is another object of the invention to provide a collimated X-ray source for X-ray lithographic systems that is more efficient than state of the art X-ray sources.

These, together with other objects, features, and advantages of the invention, will become more readily apparent from the following detailed description taken in conjunction with the illustrative embodiments in the accompanying drawings, wherein like elements are given like reference numerals throughout.

DETAILED DESCRIPTION OF THE PREFERRED EMBODIMENTS

Figure 1:
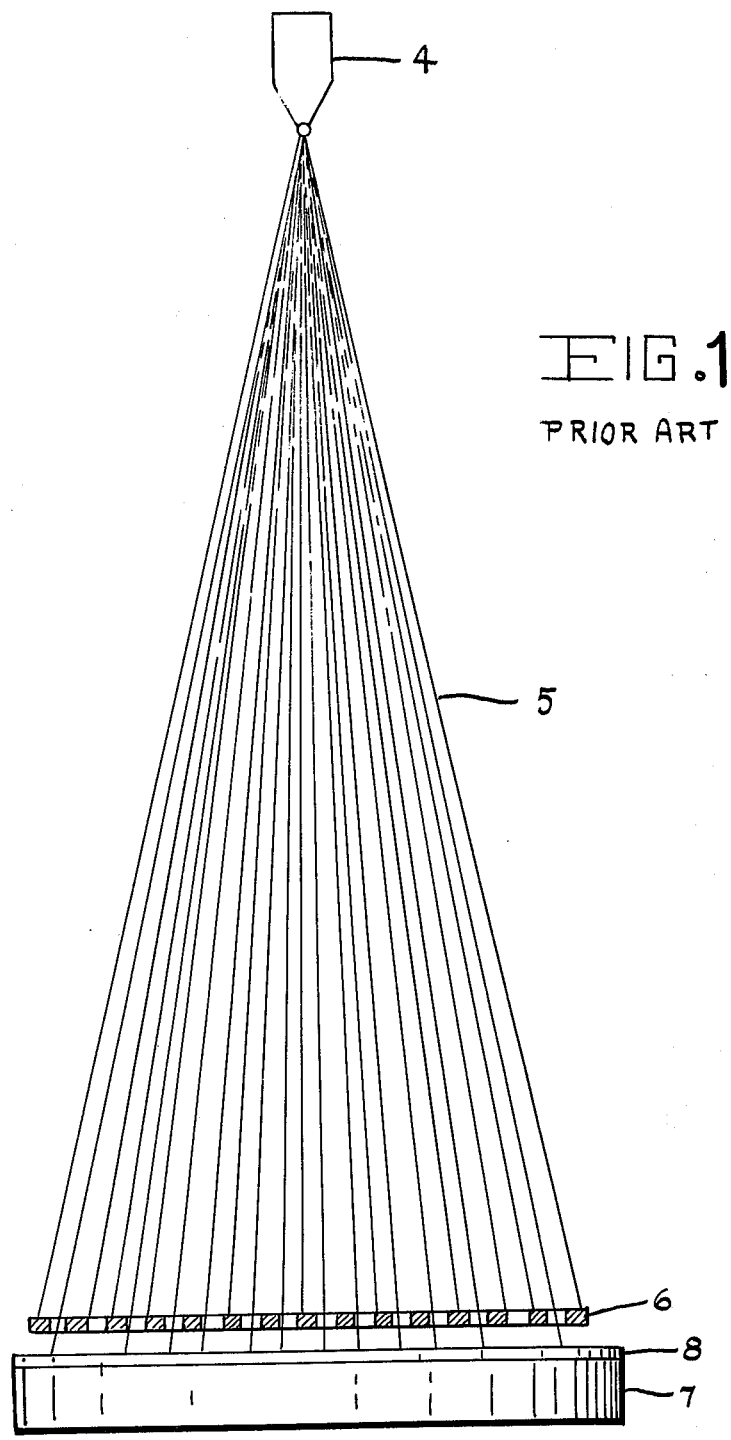
FIG. 1 illustrates a typical X-ray projection apparatus of the type used in prior art X-ray lithographic systems.

The current approach toward X-ray projection in X-ray lithographic systems is illustrated by the X-ray projection apparatus of FIG. 1. X-ray beam 5 from point X-ray source 4 illuminates substrate member 7 through mask 6. Substrate member 7 is provided with a photo resist coating 8. Mask 6 has patterned apertures through which the X-ray beam passes to expose appropriate portions of the photo resist in accordance with conventional X-ray photo-lithographic techniques. Although this projection apparatus provides an acceptably parallel X-ray beam, the power limitations of the point X-ray source imply extended exposure times and the need to illuminate the entire mask results in severe degradation of system efficiency.

Figure 2:
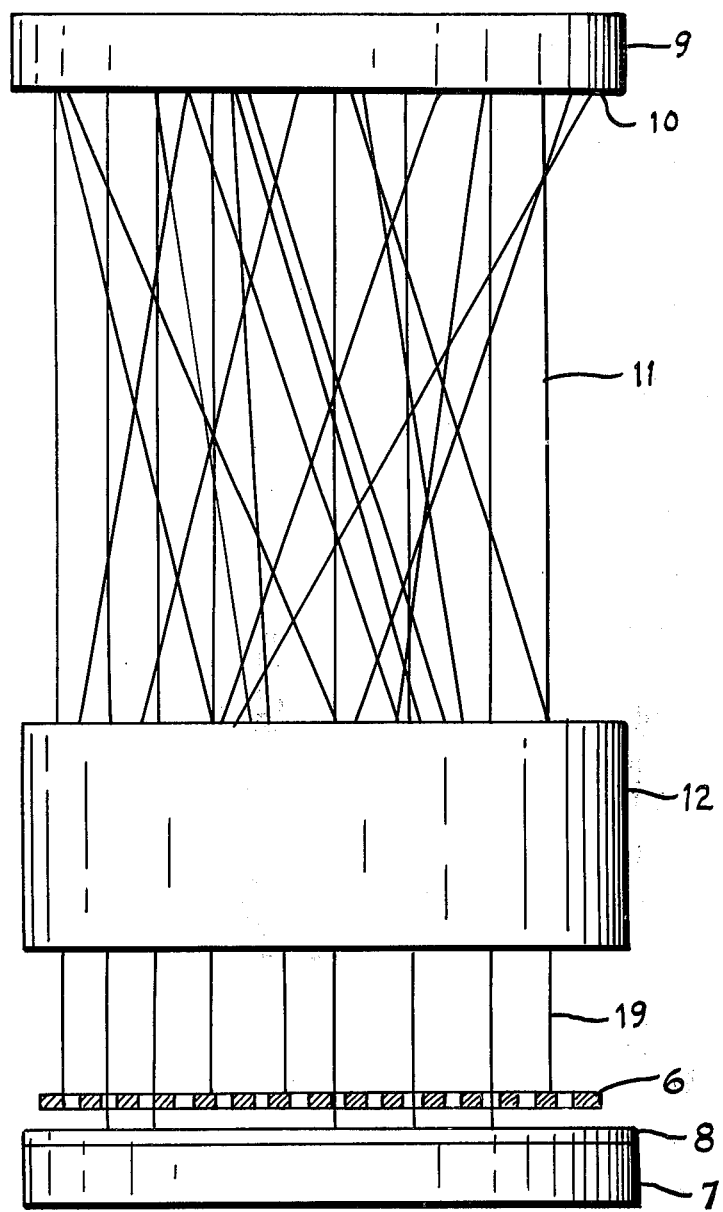
FIG. 2 illustrates one presently preferred embodiment of the X-ray projection apparatus comprehended by the present invention; and, FIG. 3 illustrates an alternative embodiment of the X-ray projection apparatus comprehended by the present invention.

X-ray projection apparatus comprehended by the present invention designed to overcome the power limitations of point source X-ray projections is illustrated by FIG. 2. Referring thereto, X-ray source 9 having an extended area X-ray emitting surface 10 is combined with an X-ray collimator 12 to provide a high power parallel ray X-ray beam 19. X-ray beam 11 as it is emitted from X-ray source 9 includes rays projected in random directions. However, collimator 12 absorbs all such errant X-ray.

Figure 3:
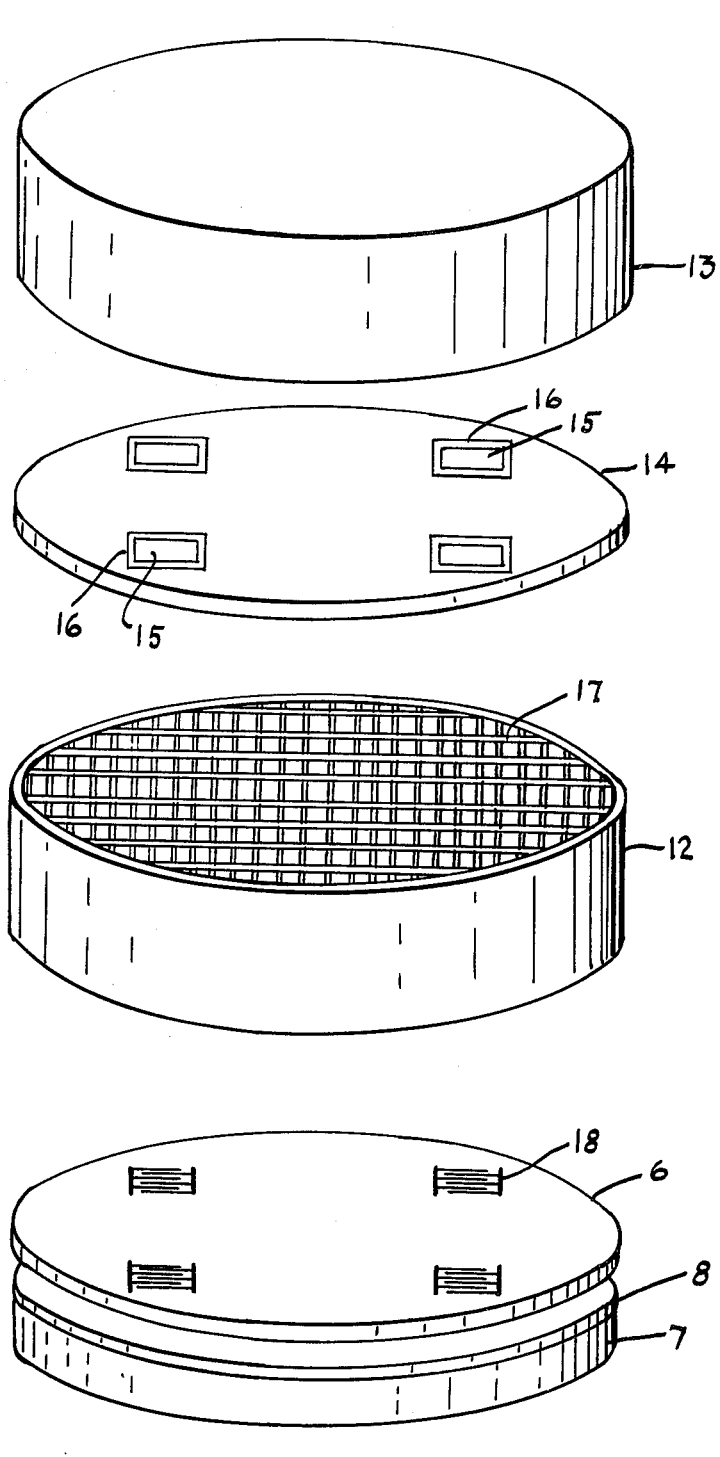

An alternative embodiment of the invention that significantly improves the efficiency of the projection system is illustrated by FIG. 3. In this arrangement the X-ray source comprises an electron beam source 13 and an X-ray target 14. Target 14 is provided with discrete areas 15 that are insulated from the remainder of the target by insulator 16. Each discrete area 15 is coextensive in area and aligned in register with a corresponding patterned aperture 18 in mask 6. Discrete areas 15 are maintained at an appropriate voltage level (−10 KV, for example) and the remainder of target 14 is at ground potential. As a consequence X-rays are projected only from these areas. The X-rays so projected are collimated by collimator 12 as in the arrangement of FIG. 2. Collimator 12 can be any conventional X-ray collimator. An example of such a collimation is the modulation collimator described by McGrath and Harwit in the publication, *A Wide Spacing Mechanical Collimator*, Applied Optics Volume 8, Number 4, April 1969. Such a collimator collimates X-rays in both the directions perpendicular to its axis by using grids composed of perpendicularly crossed slats 17. The grids are stacked directly above one another in such a way that the holes line up.

While the invention has been described with reference to its presently preferred embodiments, it is understood that the words that have been used are words of description rather than words of limitation and that changes within the purview of the appended claims may be made without departing from the scope and spirit of the invention in its broader aspects.

I claim:

1. In an X-ray lithographic system, apparatus for projecting patterned X-ray illumination onto a photo resist coated substrate member comprising an X-ray source having an extended X-ray emission area, an X-ray collimater adapted to collimate X-rays emitted from said X-ray source, and an X-ray adsorbant mask having patterned X-ray transmitting apertures therein positioned proximate to said substrate member and in intercepting relationship with X-ray illumination transmitted through said collimator said X-ray source being adapted to provide X-ray emission from only discrete portions of said extended X-ray emission area, each said discrete X-ray emitting portion being substantially coextensive in area to and aligned in register with a corresponding patterned X-ray transmitting aperture in said X-ray adsorbant mask.

* * * * *